(12) United States Patent
Gupta et al.

(10) Patent No.: US 6,515,342 B1
(45) Date of Patent: Feb. 4, 2003

(54) METHOD AND SYSTEM FOR PROVIDING INORGANIC VAPOR SURFACE TREATMENT FOR PHOTORESIST ADHESION PROMOTION

(75) Inventors: Subhash Gupta, San Jose, CA (US); Bhanwar Singh, Morgan Hill, CA (US); Carmen Morales, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/557,680

(22) Filed: Apr. 25, 2000

Related U.S. Application Data

(62) Division of application No. 08/980,888, filed on Dec. 1, 1997, now Pat. No. 6,066,578.

(51) Int. Cl.[7] ............................................. H01L 29/00
(52) U.S. Cl. .................. 257/506; 438/790; 430/317; 257/347
(58) Field of Search ................................. 438/790, 761, 438/759, 758, 689, 725; 430/317, 311; 257/347, 506

(56) References Cited

U.S. PATENT DOCUMENTS

| 5,208,066 | A | * | 5/1993 | Fujisaki et al. | 427/96 |
|---|---|---|---|---|---|
| 5,250,669 | A | * | 10/1993 | Ogawa et al. | 534/557 |
| 5,607,818 | A | * | 3/1997 | Akram et al. | 430/311 |
| 5,686,337 | A | * | 11/1997 | Koh et al. | 438/240 |
| 5,880,018 | A | * | 3/1999 | Boeck et al. | 438/619 |

* cited by examiner

Primary Examiner—Jeffrie R. Lund
(74) Attorney, Agent, or Firm—Sawyer Law Group LLP

(57) ABSTRACT

A system and method for forming a plurality of structures in a low dielectric constant layer is disclosed. The low dielectric constant layer is disposed on a semiconductor. The method and system include exposing the low dielectric constant layer to an agent that improves adhesion of a photoresist, providing a layer of the photoresist on the low dielectric constant layer, patterning the photoresist, and etching the low dielectric constant layer to form the plurality of structures.

9 Claims, 3 Drawing Sheets

METHOD AND SYSTEM FOR PROVIDING INORGANIC VAPOR SURFACE TREATMENT FOR PHOTORESIST ADHESION PROMOTION

The present application is a divisional of U.S. Ser. No. 08/980,888 filed Dec. 1, 1997 now U.S. Pat. No. 6,066,578.

FIELD OF THE INVENTION

The present invention relates to semiconductor processing and more particularly to a method and system for transferring a photoresist pattern having reduced footing to low dielectric constant materials.

BACKGROUND OF THE INVENTION

Semiconductor technology has been increasing driven to lower device size. The feature size in the current conventional semiconductor devices is on the order of 0.18 microns or less. As the size of features decreases, the thicknesses of and separation between metal lines also decreases. However, the metal lines must still be insulated from each other. As the separation between metal lines has decreased, conventional high dielectric constant materials have become less desirable for use in isolating metal lines. Instead, low dielectric constant materials, such as hydrogen silsequioxane ("HSQ"), are increasingly of interest for electrically isolating structures in sub-0.25 micron technology. Generally, a material is considered a low dielectric constant material when it has a dielectric constant on the order of 2.5 or below.

In order to use low dielectric constant materials to separate metal lines, the low dielectric constant materials must be patterned and etched. The low dielectric constant material is first deposited on the semiconductor. In a conventional method for semiconductor processing, a primer would then be applied and photoresist would be spun on to the low dielectric constant material. The photoresist would then be patterned. Finally, the low dielectric constant material would be etched to form structures, such as trenches.

The adhesion of the photoresist to the low dielectric constant material is not uniform. Instead, areas which do not adhere to the low dielectric constant material are formed. When the photoresist is patterned, pieces of the photoresist which do not adhere to the low dielectric constant material may break off. Moreover, when the low dielectric constant material is etched, the areas etched may be the wrong size. For example, although trenches may be formed in the low dielectric constant material, conventional methods may not be able to form trenches of the appropriate size, form, or separation.

In addition, the use conventional semiconductor processing methods when processing low dielectric constant materials may result in resist footing. Footing occurs when the photoresist that remains after development does not have substantially vertical walls. Instead, a foot is formed at the bottom of the wall of the feature. Thus, when the low dielectric constant material is etched, the appropriate structure is not transferred from the photoresist to the low dielectric constant material because of the foot at the base of the remaining photoresist.

Accordingly, what is needed is a system and method for providing a photoresist pattern having reduced footing and more accurately transferring the photoresist pattern to low dielectric constant materials. The present invention addresses such a need.

SUMMARY OF THE INVENTION

The present invention provides a method and system for forming a plurality of structures in a low dielectric constant layer. The low dielectric constant layer is disposed on a semiconductor. The method and system comprise exposing the low dielectric constant layer to an agent that improves adhesion of a photoresist, providing a layer of the photoresist on the low dielectric constant layer, patterning the photoresist, and etching the low dielectric constant layer to form the plurality of structures.

According to the system and method disclosed herein, the present invention provides a photoresist pattern having reduced footing and allows low dielectric constant materials to be more accurately patterned.

DETAILED DESCRIPTION OF THE INVENTION

The present invention relates to an improvement in processing of low dielectric constant materials. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
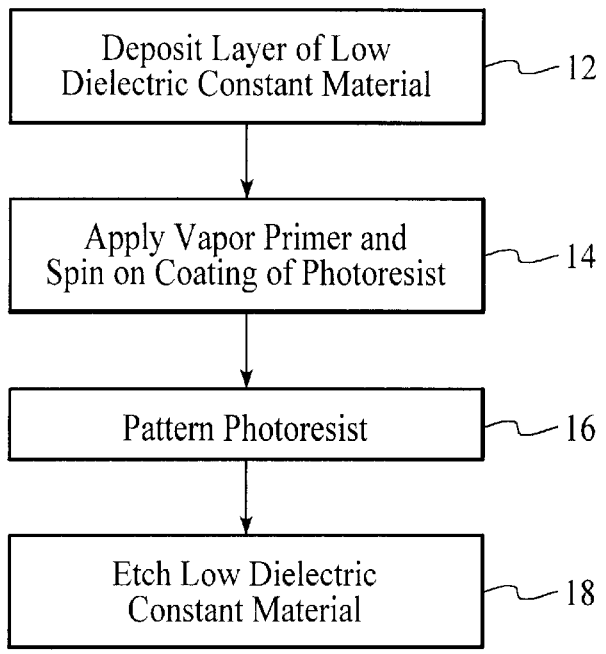
FIG. 1 is a flow chart of a conventional method used in conjunction with processing of low dielectric constant materials.

FIG. 1 is a flow chart of a conventional method for processing semiconductors using low dielectric constant materials. The low dielectric material is deposited via step 16. The low dielectric material can be deposited by spinning it on the semiconductor or by chemical vapor (CVD) deposition. The low dielectric material may also be baked. Typically, the low dielectric constant material has a dielectric constant of approximately 2.5 or less. The photoresist is then applied via step 14. The step of providing the photoresist typically includes application of a primer followed by spinning on the photoresist. One conventional chemical primer used is hexamethyldisilazane (HMDS). The chemical primer is supposed to improve the adhesion of the photoresist to the surface of the underlying low dielectric constant material. The photoresist is patterned via step 16. The low dielectric constant material is then etched via step 16. Thus, structures such as trenches are formed in the low dielectric constant material.

Although the structures in the low dielectric constant material formed using the method 10 of FIG. 1 allow for smaller feature sizes, those with ordinary skill in the art will realize that the method 100 may result in structures which do not have the correct size and shape.

Figure 2:
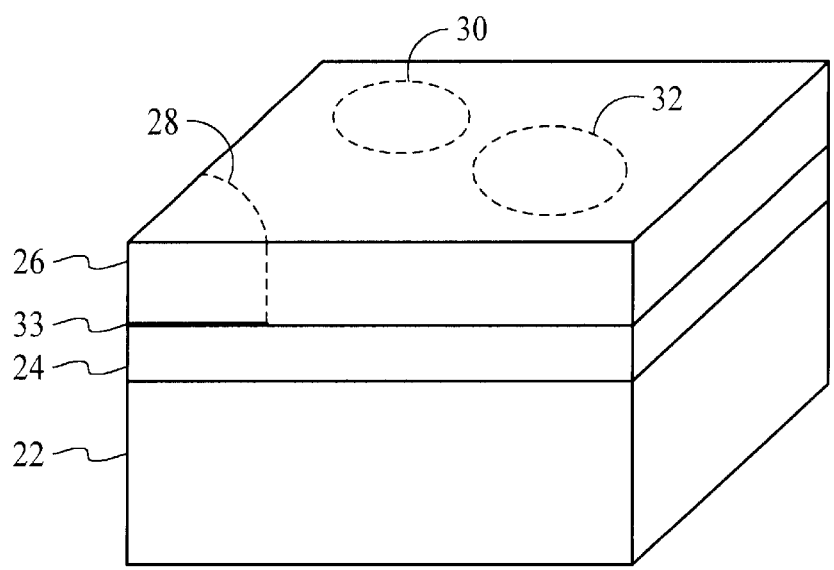
FIG. 2 is a is a block diagram depicting the semiconductor after photoresist is spun on using conventional processing methods.

FIG. 2 depicts the system 20 after the spin on of the photoresist in step 14 of FIG. 1. The system 20 includes the semiconductor 22, a layer of low dielectric constant material 24, and a layer of photoresist 26. The semiconductor 22 is typically silicon. The low dielectric material layer 24 may be hydrogen silsequioxane ("HSQ"). Because the adhesion of the photoresist 26 to the low dielectric constant material 24 is nonuniform, there are bubble-like sections 28, 30, and 32 which do not adhere to the low dielectric constant material 24. The failure of section 28 to adhere to the low dielectric constant material 24 is indicated by the dark line 33 at the interface between the low dielectric constant material 24 and the photoresist 26. The dark line 33 represents a separation between the low dielectric constant material 24 and the photoresist 26.

Because sections 28, 30, and 32 do not adhere to the low dielectric constant material, one of ordinary skill in the art will recognize that portions of sections 28, 30, and 32 may break off prior to etching of the low dielectric constant layer 24. In addition, one of ordinary skiff in the art will readily realize that structures formed in and around sections 28, 30, and 32 during etching of the low dielectric constant layer 24 may not have the correct size because of the failure of the photoresist 26 to adhere to the low dielectric constant material 24.

Figure 3:
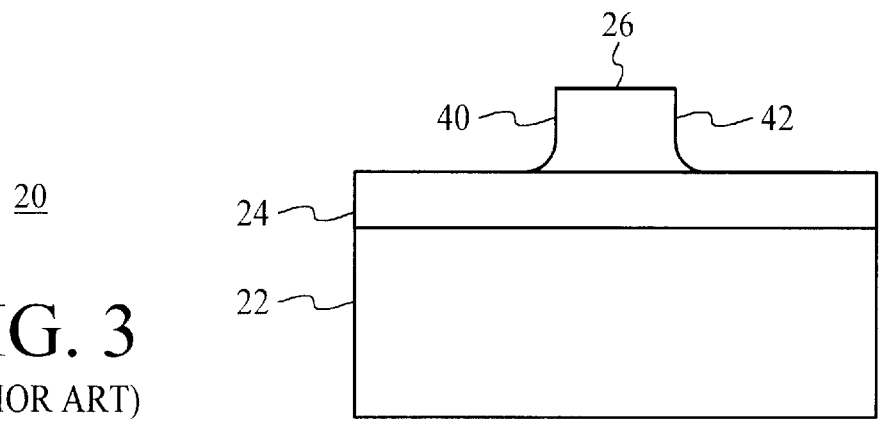
FIG. 3 is a block diagram of a side view of a portion of the semiconductor after the photoresist has been patterned.

One of ordinary skill in the art will also realize that the conventional method 10 of forming structures in the low dielectric constant material 24 may result in resist footing. FIG. 3 depicts a portion of the system 20 after step 16, patterning the photoresist. The remaining photoresist 26 is shown on top of the low dielectric constant material 24. The low dielectric constant material is disposed on the semiconductor 22. The sidewalls 40 and 42 of the remaining photoresist 26 are not substantially vertical. Instead, the lower portion of each sidewall 40 and 42 includes a foot. One of ordinary skill in the art will realize that any structures etched into the low dielectric constant layer 24 will not be of the correct size because the sidewalls 40 and 42 exhibit footing.

The present invention provides for a method and system for generating a photoresist pattern having reduced footing and more accurately transferring the photoresist pattern to a low dielectric constant material. The present invention includes exposing the low dielectric constant material to an agent that improves photoresist adhesion, providing photoresist on the low dielectric constant material, patterning the photoresist, and etching the low dielectric constant material.

The present invention will be described in terms of the low dielectric constant material HSQ and the use of a particular oxidizing gas. However, one of ordinary skill in the art will readily recognize that this method and system will operate effectively for other types of low dielectric constant materials and other chemical agents which improve photoresist adhesion.

Figure 4:
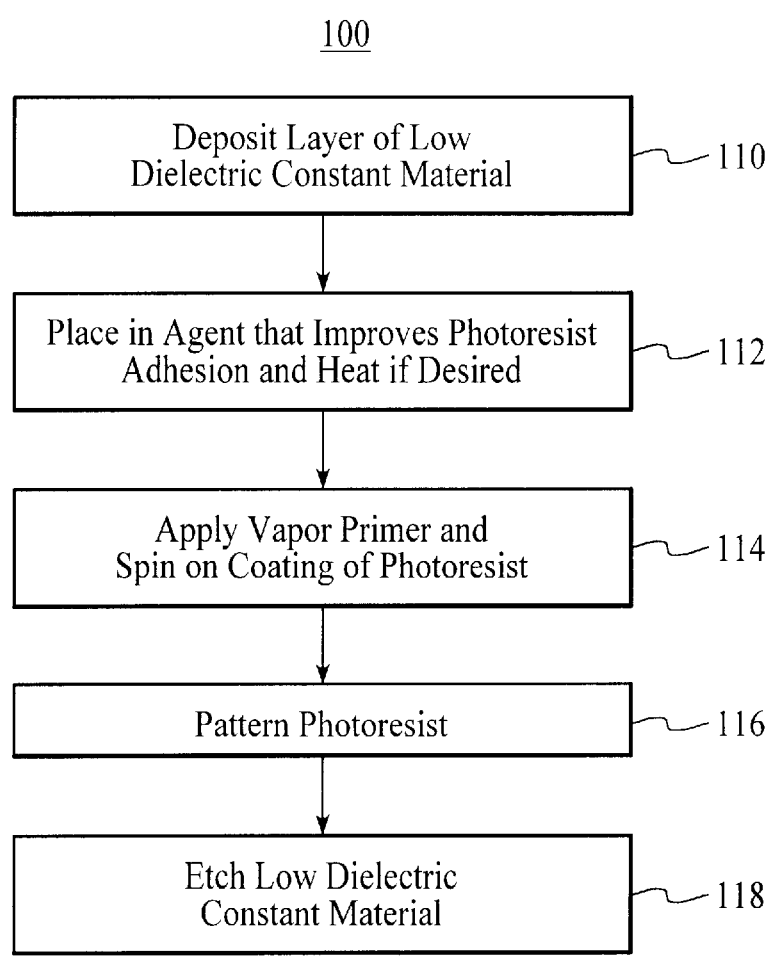
FIG. 4 is a flow chart depicting a method for processing low dielectric constant materials in accordance with the present invention.

To more particularly illustrate the system and method in accordance with the present invention, refer now to FIG. 4 depicting a flow chart of a method 100 for processing a semiconductor including a low dielectric constant layer in accordance with the present invention. The method 100 deposits the low dielectric constant layer via step 110. The low dielectric constant material can be deposited using conventional methods including spin-on and chemical vapor deposition. In a preferred embodiment, the low dielectric constant material is HSQ.

The semiconductor including the HSQ layer is then placed in an agent which improves photoresist adhesion, via step 112. In one embodiment, this agent is an oxidizing agent. In a preferred embodiment, the oxidizing agent is sulfur trioxide ($SO_3$) gas. In the preferred embodiment, the semiconductor is placed in a chamber. The chamber is then evacuated and backfilled with sulfur trioxide gas. Also in a preferred embodiment, the flow of sulfur trioxide is regulated. However, nothing in the method and system prevents the regulation of sulfur trioxide pressure rather than sulfur trioxide flow.

While in the sulfur trioxide, the semiconductor and low dielectric layer may also be heated. In a preferred embodiment, the semiconductor is heated to a relatively low temperature, approximately one hundred degrees Centigrade. Preferably, the semiconductor is heated only to moderately low temperatures, in the range of fifty to two hundred degrees Centigrade. These low temperatures are preferred because the HSQ degrades if heated to higher temperatures.

In the preferred embodiment, the semiconductor is only placed in the sulfur trioxide for a relatively short time, often as few as 120 seconds or less. This is because sulfur trioxide is a relatively strong oxidizing agent. However, nothing prevents the exposure for a different time as long as adhesion of the photoresist is improved.

In one embodiment, once the semiconductor is removed from the oxidizing agent, it is washed and dried. A layer of photoresist is then provided via step 114. In a preferred embodiment, providing the layer of photoresist includes the steps of applying a primer to the HSQ layer then spinning on the photoresist. In a preferred embodiment, the primer is HMDS and is applied as a vapor. The photoresist can then be patterned and the HSQ layer etched via steps 116 and 118, respectively.

Figure 5:
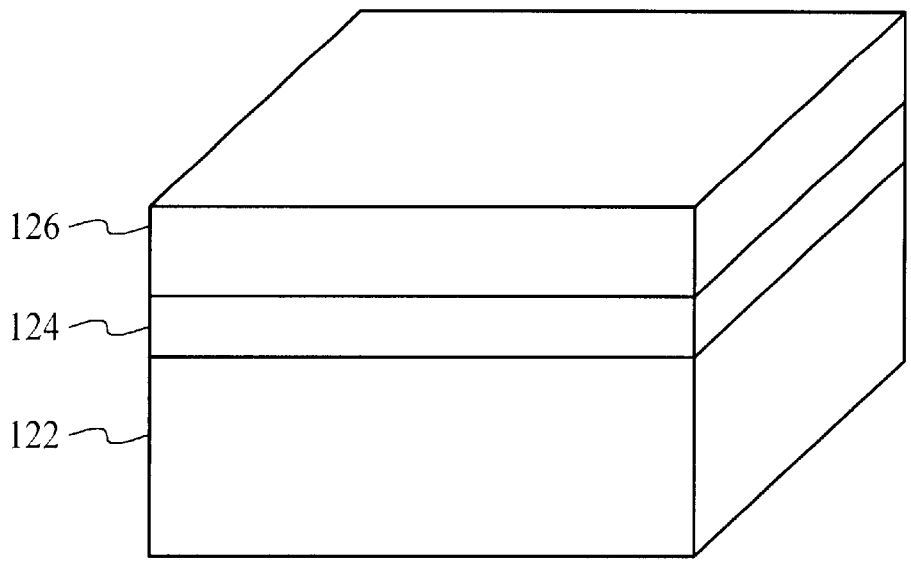
FIG. 5 is a block diagram depicting the semiconductor after photoresist is spun on in accordance with the present invention.

FIG. 5 depicts the system 120 after the photoresist has been spun on in step 14 of the method 100 in accordance with the present invention. The system includes a semiconductor 122, a layer of HSQ 124, and a layer of photoresist 126. Because the semiconductor 122 and HSQ 124 were placed in sulfur trioxide, the adhesion of the photoresist 126 is uniform. Thus, there are no bubble-like sections 28, 30, and 32 of FIG. 2 which may be present when conventional processing methods are used.

Figure 6:
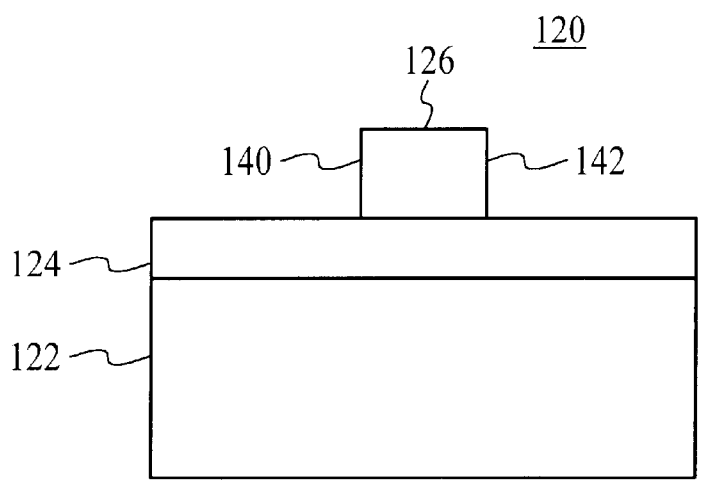
FIG. 6 depicts a block diagram of a side view of a portion of the semiconductor after the photoresist has been patterned in accordance with the present invention.

Referring now to FIG. 6, a portion of the system 120 is depicted after patterning of the photoresist in step 116. The system 120 still includes the semiconductor 22, the low dielectric constant layer 124, and the remaining photoresist 126. The remaining photoresist 126 has walls 140 and 142. The walls 140 and 142 exhibit little or no footing.

Because the adhesion of the photoresist layer 126 is good and because the walls 140 and 142 of photoresist 126 remaining after patterning exhibit little footing, accuracy of the etching of the HSQ layer 124 is improved.

Although the reason why adhesion of the photoresist layer 26 formed using conventional processing method 10 is not completely known, it is hypothesized that chemical bonding of components of the low dielectric constant layer 24 somehow prevents adhesion of the photoresist layer 26 despite application of the primer. For example, it is postulated that the hydrogen in HSQ prevents the primer from bonding with the surface of the HSQ or allows only weak O—H bonds to be formed between the primer and the HSQ surface. As a result, the photoresist 26 does not adhere well to the surface of the low dielectric constant layer 24.

Placing the system 120 in the oxidizing agent, via step 112, changes the surface chemistry of the HSQ layer 124. It is believed that the sulfur trioxide reacts with the surface of the HSQ layer 124, oxidizing axial Si—H bonds and perhaps forming an O—H bonds. This, in turn, permits the primer to bind to the treated surface of the HSQ layer 124 better. It is postulated that the primer is able to form Si—Si bonds or Si—O bonds after system 120 is placed in the oxidizing agent. The net result is the enhancement of photoresist 126 adhesion, which is spun onto the primed surface of the HSQ layer 124. It is noted that high temperature methods of treating the surface of the HSQ layer 124 are not used because the HSQ layer 124 degrades at high temperatures. Treatment with the sulfur trioxide also decreases footing on the side walls 140 and 142, perhaps due to reactions with between the sulfur trioxide and nitrogen existing in the HSQ layer 124 due to processing the HSQ layer in a gas containing nitrogen.

A method and system has been disclosed for treating a layer of low dielectric constant material to improve photoresist adhesion and, therefore, improve accuracy of etching the photoresist layer. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device comprising:
    a low dielectric constant layer having a plurality of structures formed therein, the low dielectric constant layer having a dielectric constant of 2.5 or less, at least a portion of the plurality of structures being formed by exposing the low dielectric constant layer to an agent that improves adhesion of a photoresist, the agent being an oxidizing agent, providing a layer of the photoresist on the low dielectric constant layer, patterning the layer of photoresist to a desired size for each of the portion of the plurality of structures, and etching the low dielectric constant layer to form the plurality of structures in the low dielectric constant layer, the plurality of structures having the desired size.

2. The semiconductor device of claim 1 wherein the low dielectric constant layer further includes hydrogen silsequioxane.

3. The semiconductor device of claim 1 wherein the agent is sulfur trioxide gas.

4. The semiconductor device of claim 1 wherein the at least the portion of the plurality of structures are further formed by heating the low dielectric constant layer to a moderately low temperature during exposure to the agent that improves adhesion of the photoresist.

5. The semiconductor device of claim 4 wherein the moderately low temperature further includes temperatures below 200 degrees Centigrade.

6. The semiconductor device of claim 4 wherein the moderately low temperature further includes temperatures below 100 degrees Centigrade.

7. The semiconductor device of claim 1 wherein the at least the portion of the plurality of structures are formed by exposing the low dielectric constant layer to an agent that reduces footing.

8. The semiconductor device of claim 7 wherein the agent that reduces footing is the same as the agent that improves adhesion of the photoresist.

9. A semiconductor device during fabrication comprising:
    a low dielectric constant layer, the low dielectric constant layer having a dielectric constant of 2.5 or less; and
    a photoresist layer on the low dielectric constant layer, the photoresist layer having a plurality of apertures therein for forming a plurality of structures in the low dielectric constant layer, the plurality of apertures being formed by exposing the low dielectric constant layer to an agent that improves adhesion of the photoresist layer, the agent being an oxidizing agent, providing the photoresist layer on the low dielectric constant layer, and patterning the photoresist layer, such that a remaining portion of the photoresist layer adheres to the dielectric constant layer and the plurality of apertures are substantially free of footings.

* * * * *